(12) United States Patent
Liao et al.

(10) Patent No.: US 7,950,946 B2
(45) Date of Patent: May 31, 2011

(54) ELECTRICAL CONNECTOR FOR RECEIVING CPU

(75) Inventors: Fang-Jwu Liao, Tu-Cheng (TW); Chun-Yi Chang, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/607,083

(22) Filed: Oct. 28, 2009

(65) Prior Publication Data
US 2010/0105218 A1    Apr. 29, 2010

(30) Foreign Application Priority Data
Oct. 28, 2008   (TW) .............................. 97219178 U

(51) Int. Cl.
*H01R 13/62* (2006.01)
(52) U.S. Cl. ...................................................... 439/330
(58) Field of Classification Search .................. 439/330, 439/331, 73, 296, 373, 71, 525, 531, 64, 439/66, 82
See application file for complete search history.

(56) References Cited

U.S. PATENT DOCUMENTS

| | | | | |
|---|---|---|---|---|
| 4,616,895 A * | 10/1986 | Yoshizaki et al. | ............ | 439/330 |
| 4,664,458 A * | 5/1987 | Worth | .............................. | 439/82 |
| 4,744,009 A * | 5/1988 | Grabbe et al. | ................ | 361/749 |
| 4,768,973 A * | 9/1988 | Bakermans | .................... | 439/331 |
| 4,789,345 A * | 12/1988 | Carter | ............................. | 439/71 |
| 4,832,612 A * | 5/1989 | Grabbe et al. | .................. | 439/71 |
| 5,022,869 A * | 6/1991 | Walker | .......................... | 439/526 |
| 5,066,245 A * | 11/1991 | Walker | .......................... | 439/526 |
| 5,073,116 A * | 12/1991 | Beck, Jr. | ....................... | 439/71 |
| 5,375,710 A * | 12/1994 | Hayakawa et al. | ........... | 206/724 |
| 5,423,687 A * | 6/1995 | Laub | ............................... | 439/69 |
| 5,713,744 A * | 2/1998 | Laub | ............................... | 439/71 |
| 5,813,869 A * | 9/1998 | Matsumura | ..................... | 439/72 |
| 6,114,757 A * | 9/2000 | DelPrete | ....................... | 257/678 |
| 6,164,980 A * | 12/2000 | Goodwin | ........................ | 439/70 |
| 6,210,197 B1 * | 4/2001 | Yu | .................................. | 439/342 |
| 6,338,409 B1 * | 1/2002 | Neary | .......................... | 206/710 |
| 6,644,981 B2 * | 11/2003 | Choy | .............................. | 439/70 |
| 6,733,304 B1 * | 5/2004 | Liao | ............................... | 439/66 |
| 6,945,794 B1 * | 9/2005 | Yang et al. | ..................... | 439/73 |
| 7,361,028 B1 * | 4/2008 | Polnyl | ............................ | 439/68 |
| 7,542,307 B2 * | 6/2009 | Liao | .............................. | 361/810 |
| 7,654,830 B2 * | 2/2010 | Lin | ................................. | 439/71 |
| 2005/0174744 A1 * | 8/2005 | Zheng | .......................... | 361/760 |
| 2006/0033518 A1 * | 2/2006 | LaMeres et al. | .............. | 324/758 |
| 2007/0155206 A1 * | 7/2007 | Fan | ............................... | 439/135 |
| 2007/0232114 A1 * | 10/2007 | Hsieh et al. | .................... | 439/342 |
| 2009/0253277 A1 * | 10/2009 | Hsieh | ............................. | 439/68 |

* cited by examiner

*Primary Examiner* — T C Patel
*Assistant Examiner* — Harshad C Patel
(74) *Attorney, Agent, or Firm* — Andrew C. Cheng; Wei Te Chung; Ming Chieh Chang

(57) ABSTRACT

An electrical connector (1) for receiving a CPU (5) includes a rectangular planar receiving portion (10) having a top surface (14) for mating with the CPU. At least two posts (20) extend perpendicularly from corners of the planar receiving portion. At least two posts and the planar receiving portion together define a receiving space for receiving the CPU. The post includes a resilient portion (22) and a fixing portion (24). A gap (241) is defined between a resilient portion and a fixing portion, and the resilient portion forms a protrusion block (26) protruding into the receiving space.

20 Claims, 2 Drawing Sheets

ELECTRICAL CONNECTOR FOR RECEIVING CPU

BACKGROUND OF THE INVENTION

1. Field of the Invention

The present invention generally relates to an electrical connector, and in particularly to a central processing unit (CPU) socket for receiving a CPU.

2. Description of Related Patent

Conventionally, the CPU socket is an electrical device for providing an electrical connecting path between a print circuit board (PCB) and a CPU. The CPU socket includes an insulative housing and a plurality of terminals received in the insulative housing. The insulative housing is rectangular, and a top surface of the insulative housing defines a receiving space for receiving the CPU. The plurality of terminals are received in a bottom wall of the receiving space. The receiving space is rectangular, and is surrounded by four lateral side walls. A flexible arm is formed on an inner surface of two of the four lateral side walls, and the flexible arm extends in two the receiving space to engage with the CPU. The CPU is suffered pressure force from the flexible arm. Therefore, the CPU is fixed in the receiving space.

Currently, the size of the CPU socket became smaller and smaller. The traditional CPU socket can not fit the miniaturization trend, because the structure of the CPU socket is more complex.

Therefore, it is desirable to provide a new CPU socket that eliminates the aforesaid problems.

BRIEF SUMMARY OF THE INVENTION

Accordingly, an object of the present invention is to provide a new CPU socket with simple structure.

In order to achieve afore-mentioned object, the CPU socket for receiving a CPU comprises a rectangular planar receiving portion having a top surface for mating with the CPU. At least two posts extend perpendicularly from corners of the planar receiving portion, at least two posts and the planar receiving portion together defines a receiving space for receiving the CPU. The post comprises a resilient portion and a fixing portion. A gap is defined between a resilient portion and a fixing portion, and the resilient portion forms a protrusion block protruding into the receiving space.

Other objects, advantages and novel features of the invention will become more apparent from the following detailed description of the present embodiment when taken in conjunction with the accompanying drawings.

DETAILED DESCRIPTION OF THE INVENTION

Figure 1:
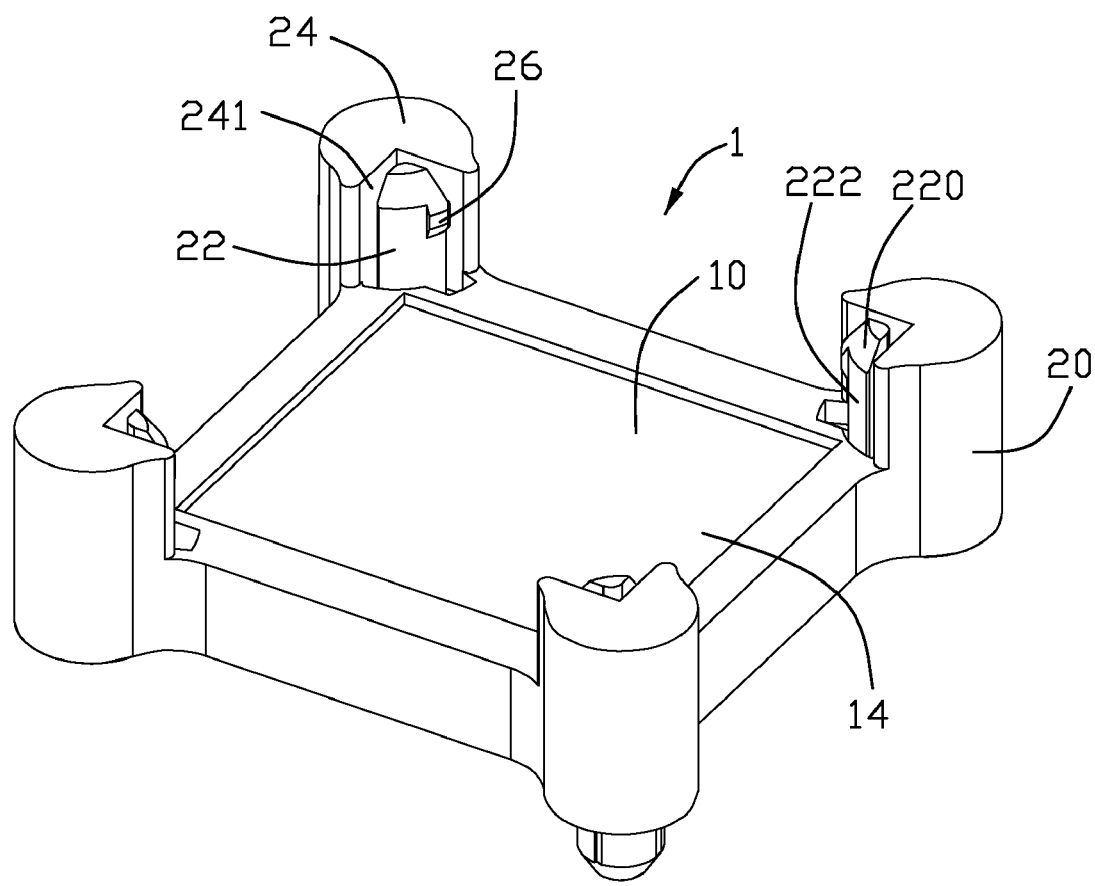
FIG. 1 is a perspective view of a CPU socket in accordance to the present invention.
Figure 2:
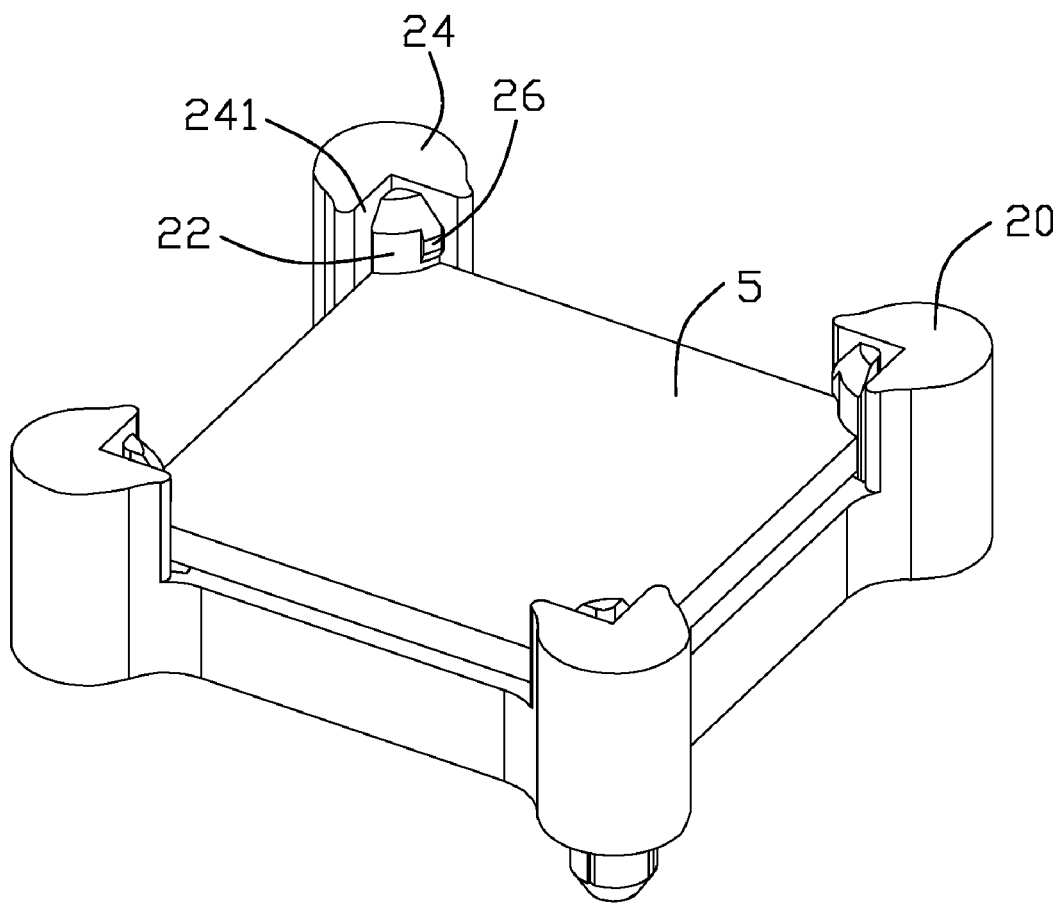
FIG. 2 is a perspective view of the CPU socket has a CPU.

Reference to FIGS. 1 to 2, the present invention relates to a CPU socket 1 for receiving a CPU 5. The CPU socket 1 includes a planar receiving portion 10 and the planar receiving portion 10 is rectangular. Each corner (not labeled) of the rectangular planar receiving portion 10 has post 20. The four posts 20 and the planar receiving portion 10 form a receiving space (not labeled) for receiving the CPU 5. The planar receiving portion 10 and the four posts 20 are formed integrally. A plurality of terminals (not shown) is received in the planar receiving portion 10 for providing an electrical connecting between the CPU 5 and a PCB (not shown) or other similar electrical devices.

The post 20 includes a resilient portion 22 and a fixing portion 24 paralleled to the resilient portion 22. The resilient portion 22 and the fixing portion 24 are extended upwardly from a top surface 14 of the planar receiving portion 10 and perpendicular to the top surface 14. The resilient portion 22 is disposed on an inner side of the fixing portion 24. There is a gap 241 defined between the resilient portion 22 and the fixing portion 24. The resilient portion 22 has a tip end 220 and a main portion 222. The tip end 220 defines a guiding surface (not labeled). A protruding block 26 is defined on an inner surface of the resilient portion 22, and the protruding block 26 is disposed on a connecting portion between the tip end 220 and the main portion 222.

When the CPU 5 is disposed in the receiving space, the CPU 5 engages with the guiding surfaces of the four tip ends 220. And the resilient portion 22 is driven by the CPU 5 to flex to the fixing portion 24. The fixing portion 24 is able to prevent the flexible flexing excessively. After the CPU 5 being completely received in the receiving space, the inner surface of the resilient portion 22 engages with the CPU 5 to fix the CPU 5 in the receiving space. The protruding block 26 restricts the CPU 5 removing from the receiving space.

The post 20 in the present invention includes a fixing portion 24 and a resilient portion 22. The gap 241 between the fixing portion 24 and the resilient portion 22 make the resilient portion 22 is able to flex to the fixing portion 24. And the fixing portion 24 is able to engage with the resilient portion 22 to prevent the flexible flexing excessively.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
 a receiving portion of substantial rectangular shape and having a top surface for mating with an electronic module;
 at least two posts extending upwardly from corners of the receiving portion, the at least two posts and the receiving portion together defining a receiving space for receiving the electronic module; and
 a plurality of terminals received in the receiving portion and extending towards the top surface for electrically connecting the electronic module;
 each post comprising a resilient portion, a fixing portion and a gap formed by the resilient portion and the fixing portion, the resilient portion being deformable in the gap and being outwardly limited by the fixing portion, the resilient portion being located at an inner side of the corresponding fixing portion and comprising a protrusion block protruding inwardly into the receiving space, wherein
 the resilient portions are adapted for clipping and outwardly restricting the electronic module in a horizontal direction, and the protrusion blocks are adapted for limiting the electronic module in a vertical direction perpendicular to the horizontal direction.

2. The electrical connector as claimed in claim 1, wherein the protrusion block protrudes from the resilient portion along a direction parallel to a diagonal of the receiving portion, and the direction is offset from the diagonal along the horizontal direction.

3. The electrical connector as claimed in claim 1, wherein the resilient portion comprises a tapered tip end defines an arced guiding surface for guiding insertion of the electronic module into the receiving space.

4. The electrical connector as claimed in claim 1, wherein the protrusion block is joint with the arced guiding surface.

5. The electrical connector as claimed in claim 1, wherein the fixing portion defines a right angle cutout to receive the corresponding resilient portion.

6. The electrical connector as claimed in claim 5, wherein the fixing portion comprises a first surface and a second surface perpendicular to the first surface to jointly form the cutout, the resilient portion comprising a third surface facing the first surface and a fourth surface facing the second surface, the gap being formed between the first surface and the third surface, and between the second surface and the fourth surface, the protrusion block being located nearer the fourth surface with respect to the third surface.

7. The electrical connector as claimed in claim 1, wherein the receiving space is rectangular shaped and comprises a vertex corresponding to one of the resilient portions, and the protrusion block of the one of the resilient portions is offset from the vertex along the vertical direction.

8. The electrical connector as claimed in claim 1, wherein a part of the fixing portion extending beyond the top surface is substantial of the same height as another part of the resilient portion extending beyond the top surface.

9. An electrical connector comprising:
an insulative housing including a plurality of fixing portions at four corners and commonly defining a center receiving portion thereamong for receiving an electronic package therein, each of said fixing portions defining a right angle recess diagonally facing said center receiving portion;
a plurality of resilient portions respectively located in the corresponding recesses and respectively spaced from the corresponding fixing portions, and facing toward said center receiving portion; each of said resilient portions defining a tapered tip end and a protruding block below said tapered tip end.

10. The electrical connector as claimed in claim 9, wherein said resilient portion essentially spans with a ninety-degree range while said protruding block only occupies a portion of said ninety-degree range.

11. The electrical connector as claimed in claim 10, wherein said resilient portion includes a middle vertical section, and upper and lower wedged section by two ends of said vertical section in a vertical direction, and wherein said upper wedged section is linked to the tapered tip end.

12. The electrical connector as claimed in claim 10, wherein said protruding block is located around one of the end position within said ninety-degree range.

13. The electrical connector as claimed in claim 10, wherein said housing defines a through hole located under and vertically aligned with each of the corresponding protruding block for injection molding consideration under condition that said through hole is covered by said electronic package when said electronic package is received in said center receiving portion.

14. The electrical connector as claimed in claim 9;
wherein said center receiving portion defines a center receiving space horizontally laterally and outwardly extending through the insulative housing along four directions so as to not only at least partially be laterally exposed to an exterior for easy operation but also have the plurality of fixing portions discrete from each other for no mutual influence.

15. The electrical connector as claimed in claim 9, wherein the center receiving space is rectangular shaped and comprises four vertexes corresponding to the resilient portions, and the protrusion block of at least one of the resilient portions is offset from the nearest vertex along a vertical direction.

16. The electrical connector as claimed in claim 9, wherein each fixing portion comprises a first surface and a second surface perpendicular to the first surface to jointly form the right angle recess, the corresponding resilient portion comprising a third surface facing the first surface and a fourth surface facing the second surface, the protruding block being located nearer the fourth surface with respect to the third surface.

17. The electrical connector as claimed in claim 9, wherein a part of each fixing portion extending beyond the center receiving portion is substantial of the same height as another part of the corresponding resilient portion extending beyond the center receiving portion.

18. The electrical connector as claimed in claim 9, wherein the center receiving space is for receiving an electronic module which is clipped and outwardly restricted by the resilient portions in a horizontal direction, and is restricted by the protruding blocks in a vertical direction as well.

19. An electrical connector comprising:
a receiving portion;
a plurality of posts extending upwardly at four corners of the receiving portion, the posts and the receiving portion commonly defining a receiving space for receiving the electronic module; and
a plurality of terminals received in the receiving portion for electrically connecting the electronic module;
each post comprising a resilient portion, a fixing portion and a gap formed by the resilient portion and the fixing portion, the resilient portion being deformable in the gap and being outwardly limited by the fixing portion, the resilient portion being located at an inner side of the corresponding fixing portion and comprising a protrusion block protruding inwardly into the receiving space, wherein
the receiving space is rectangular shaped and comprises four vertexes corresponding to the resilient portions, and the protrusion block of at least one of the resilient portions is offset from the nearest vertex along a vertical direction.

20. The electrical connector as claimed in claim 19, wherein the electronic module is adapted for being clipped and outwardly restricted by the resilient portions in a horizontal direction, the at least one of the resilient portions essentially spanning with a ninety-degree range while the protrusion block only occupies a part of the ninety-degree range so that the electronic module easily overcomes the protrusion block to be received in the receiving space.

* * * * *